(12) United States Patent
Zupac et al.

(10) Patent No.: US 7,821,102 B2
(45) Date of Patent: Oct. 26, 2010

(54) POWER TRANSISTOR FEATURING A DOUBLE-SIDED FEED DESIGN AND METHOD OF MAKING THE SAME

(75) Inventors: Dragan Zupac, Chandler, AZ (US);
Sandra J. Wipf, Phoenix, AZ (US);
Theresa M. Keller, Chandler, AZ (US);
Elizabeth C. Glass, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 560 days.

(21) Appl. No.: 11/671,035

(22) Filed: Feb. 5, 2007

(65) Prior Publication Data
US 2008/0150082 A1    Jun. 26, 2008

Related U.S. Application Data

(60) Provisional application No. 60/871,112, filed on Dec. 20, 2006.

(51) Int. Cl.
*H01L 27/082* (2006.01)
*H01L 29/70* (2006.01)

(52) U.S. Cl. .................... 257/575; 257/197; 257/565; 257/582; 257/587

(58) Field of Classification Search ......... 257/162–166, 257/197, 565, 575, 578–584, 587, E29.026, 257/E29.114, E29.124, E29.174, E29.184
See application file for complete search history.

(56) References Cited

U.S. PATENT DOCUMENTS 6,043,553 A * 3/2000 Suzuki ..................... 257/587

6,998,699 B2 * 2/2006 Hulvey et al. ............... 257/578
7,589,379 B2 * 9/2009 Amaratunga et al. ........ 257/347

(Continued)

OTHER PUBLICATIONS

Carrara, Francesco et al.; "A 1.8GHz High-Efficiency 34-dBm Silicon Bipolar Power Amplifier"; IEEE Transactions on Microwave Theory snd Techniques; Dec. 2002; pp. 2963-2970; vol. 50, No. 12; IEEE.

(Continued)

*Primary Examiner*—Hung Vu

(57) ABSTRACT

A power transistor (210) comprises a plurality of unit cell devices (212), a base contact configuration, an emitter contact configuration, and a collector contact configuration. The plurality of unit cell devices is arranged along an axis (194), each unit cell device including base (80), emitter (82), and collector (84) portions. The base contact configuration includes (i) a first base feed (150) coupled to the base portion of each unit cell device via a first end of at least one base finger (154) associated with a corresponding unit cell device and (ii) a second base feed (152) coupled to the base portion of each unit cell device via an opposite end of the at least one base finger associated with the corresponding unit cell device. The emitter contact configuration includes (i) a first emitter feed (172) coupled to the emitter portion of each unit cell device via a first end of an emitter metallization (176) associated with a corresponding unit cell device and (ii) a second emitter feed (174) coupled to the emitter portion of each unit cell device via an opposite end of the emitter metallization associated with the corresponding unit cell device. The collector contact configuration includes a collector feed (188) coupled to the collector portion of each unit cell device.

19 Claims, 12 Drawing Sheets

U.S. PATENT DOCUMENTS

| | | |
|---|---|---|
| 7,683,483 B2 | 3/2010 | Secareanu et al. |
| 2004/0099879 A1 | 5/2004 | Chen et al. |
| 2005/0082576 A1 | 4/2005 | Wu et al. |
| 2005/0151159 A1 | 7/2005 | Ma et al. |

OTHER PUBLICATIONS

Bischof, Werner; "SiGe-Power Amplifiers in Flipchip and Packaged Technology"; IEEE Radio Frequency Integrated Circuits Symposium; 2001; pp. 35-38; IEEE.

* cited by examiner

POWER TRANSISTOR FEATURING A DOUBLE-SIDED FEED DESIGN AND METHOD OF MAKING THE SAME

CROSS-REFERENCE TO CO-PENDING APPLICATIONS

This application claims priority to provisional patent application Ser. No. 60/871,112 entitled "POWER TRANSISTOR FEATURING A DOUBLE-SIDED FEED DESIGN AND METHOD OF MAKING THE SAME," filed on Dec. 20, 2006, and assigned to the assignee of the present application.

FIELD

The present disclosures relate to transistors, and more particularly, to power transistors featuring a double-sided feed design and method for making the same.

RELATED ART

FIG. 1 is an illustrative view of a power transistor wire-bond layout configuration 10 as is known in the art. The power transistor layout includes a first bank of single-sided feed (SSF) power transistor unit cell devices 12 and a second bank of SSF power transistor unit cell devices 14. The power transistor layout 10 further includes a base wire bond pad 16, emitter wire bond pads 18, and collector wire bond pads 20. The base wire bond pad 16 couples to the bases of the SSF power transistor unit cell devices of the first and second banks of SSF power transistor devices (12 and 14, respectively) via base metallization 22.

The emitter wire bond pads 18 couple to the emitters of the SSF power transistor unit cell devices of the first and second banks of SSF power transistor devices (12 and 14, respectively) via emitter feed metallizations 24 and 26, respectively. More particularly, the emitter feed metallizations (24 and 26) couple to the emitters of the first and second banks (12 and 14, respectively) via emitter ballast resistors (not shown) in regions indicated by reference numerals 28 and 30, respectively, formed within the substrate of the power transistor device. In addition, the collector wire bond pads 20 couple to the collectors of the SSF power transistor unit cell devices of the first and second banks of SSF power transistor devices (12 and 14, respectively) via collector metallization 32. The wire bond pads 16, 18 and 20 are located proximate an outer periphery of the power transistor layout.

Furthermore, power transistor device designs known in the art are generally not symmetrical and are also not designed for best thermal performance of a flip-chip die. Simply converting an existing power transistor design's wire-bond pads to bump pads for a flip-chip die results in a significant increase in junction temperature within the device. Such an increase in junction temperature may lead to thermal instability and thermal runaway. In the context of an RF power amplifier, emitter ballast resistor values can be increased to prevent thermal instabilities; however, the increase in emitter ballast resistor values is a tradeoff at the expense of RF performance.

Accordingly, there is a need for an improved method and apparatus for overcoming the problems in the art as discussed above.

BRIEF DESCRIPTION OF THE DRAWINGS

The present invention is illustrated by way of example and not limited by the accompanying figures, in which like references indicate similar elements, and in which.

The use of the same reference symbols in different drawings indicates similar or identical items. Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

As used herein, a semiconductor substrate can be any semiconductor material or combinations of materials, such as gallium nitride, gallium arsenide, silicon germanium, silicon, monocrystalline silicon, the like, and combinations of the above.

The embodiments of the present disclosure include a symmetrical device design where all base and emitter fingers are connected from both ends of each finger (double-sided base and emitter feeds), and emitter bumps are placed on both sides of the fingers (in other words, proximate opposite ends of each unit cell device in a bank of unit cell devices) which advantageously doubles the number of thermal conductors to the substrate. Such a design provides a double-sided path for heat dissipation, and also reduces base and emitter routing resistance and inductance. Improved thermal stability allows a reduction in die area and a reduction in emitter ballast resistance required to avoid thermal instability and maintain ruggedness. RF performance is improved both by the reduction in routing resistance and inductance, and by the reduced value of the emitter ballast resistance.

In one embodiment, the symmetrical flip-chip design with double-sided feed of the emitter and base fingers provides a power amplifier device with improved RF performance, enhanced ruggedness, and reduced die size for wireless power amplifier applications.

Figure 1:
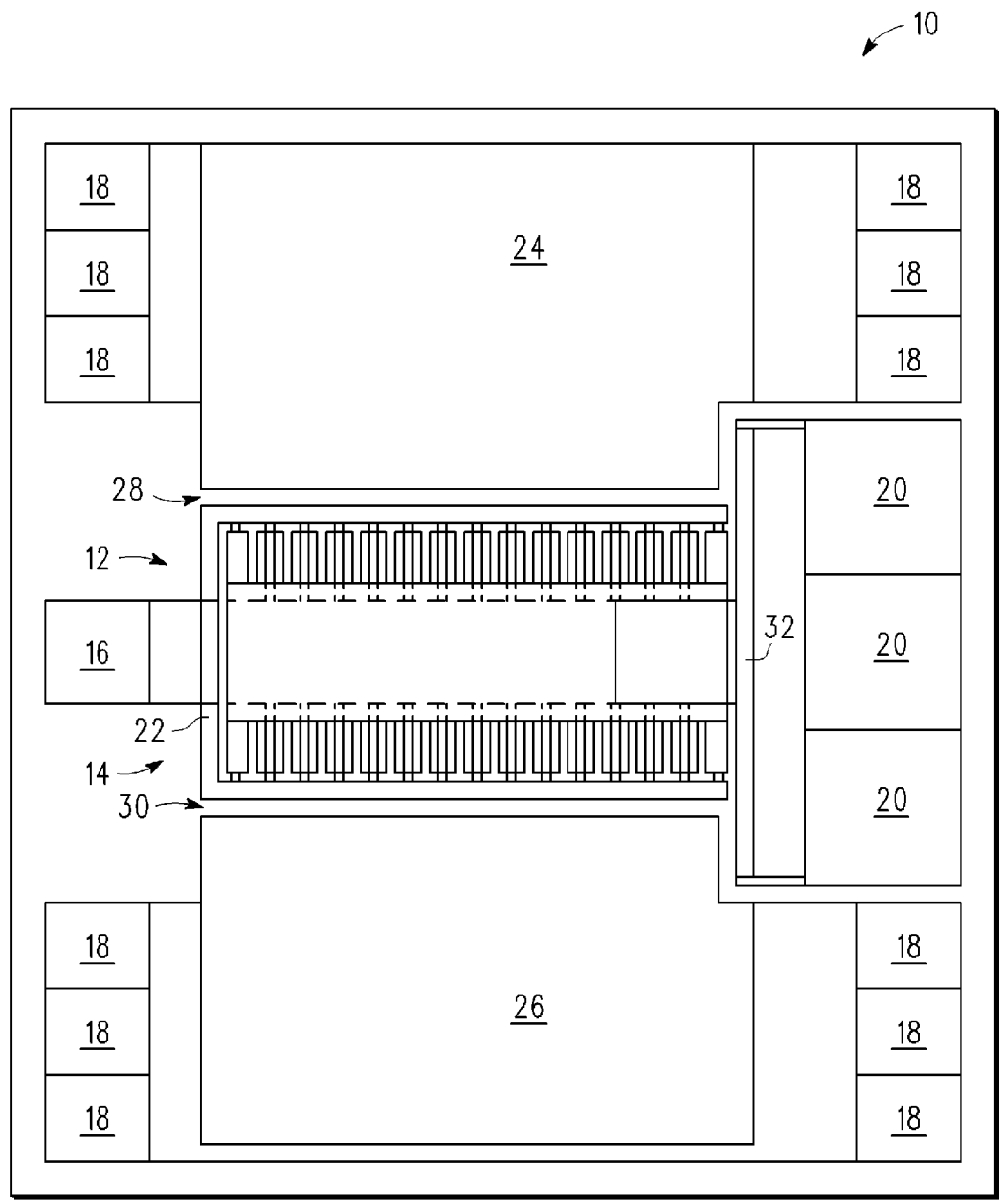
FIG. 1 is an illustrative view of a power transistor wire-bond layout configuration as is known in the art.
Figure 2:
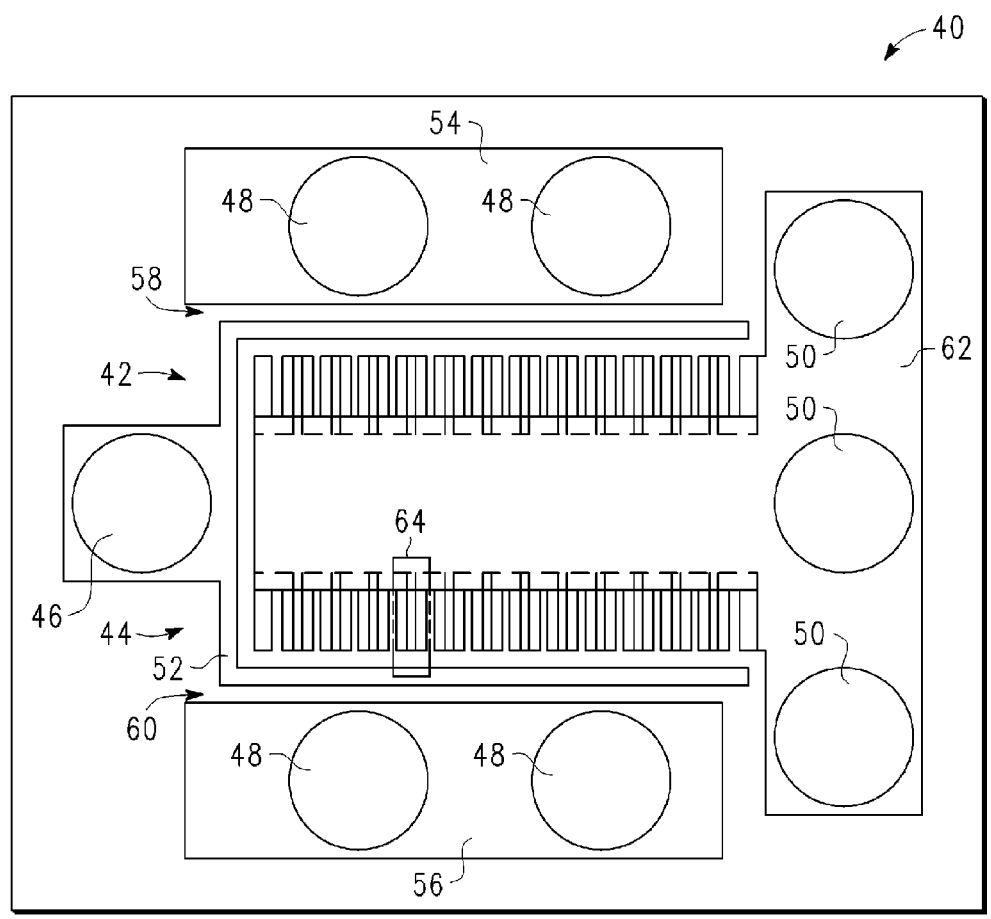
FIG. 2 is an illustrative view of a single-sided feed (SSF) power transistor flip-chip layout configuration.

Prior to a further discussion of the double-sided feed (DSF) power transistor flip-chip layout configuration according to the embodiments of the present disclosure, let us first consider the following. FIG. 2 is an illustrative view of a single-sided feed (SSF) power transistor flip-chip layout configuration 40 that can be obtained by a simple conversion of the wire-bond implementation 10 into a flip-chip configuration. The power transistor layout 40 includes a first bank of single-sided feed (SSF) power transistor unit cell devices 42 and a second bank of SSF power transistor unit cell devices 44. The power transistor layout 40 further includes a base flip-chip bump site or pad 46, emitter flip-chip bump sites or pads 48, and collector flip-chip bump sites or pads 50. The base flip-chip bump site 46 couples to the bases of the SSF power transistor unit cell devices of the first and second banks of SSF power transistor devices (42 and 44, respectively) via base metallization 52.

The emitter flip-chip bump sites 48 couple to the emitters of the SSF power transistor unit cell devices of the first and second banks of SSF power transistor devices (42 and 44, respectively) via emitter feed metallizations 54 and 56, respectively. More particularly, the emitter feed metallizations (54 and 56) couple to the emitters of the first and second banks (42 and 44, respectively) via emitter ballast resistors (not shown) in regions indicated by reference numerals 58 and 60, respectively, formed within the substrate of the power transistor device. In addition, the collector flip-chip bump sites 50 couple to the collectors of the SSF power transistor unit cell devices of the first and second banks of SSF power transistor devices (42 and 44, respectively) via collector metallization 62. The flip-chip bump sites 46, 48 and 50 are located proximate an outer periphery of the power transistor layout. A portion 64 of the bank of SSF unit cell devices will now be discussed with respect to FIGS. 3-8.

Figure 3:
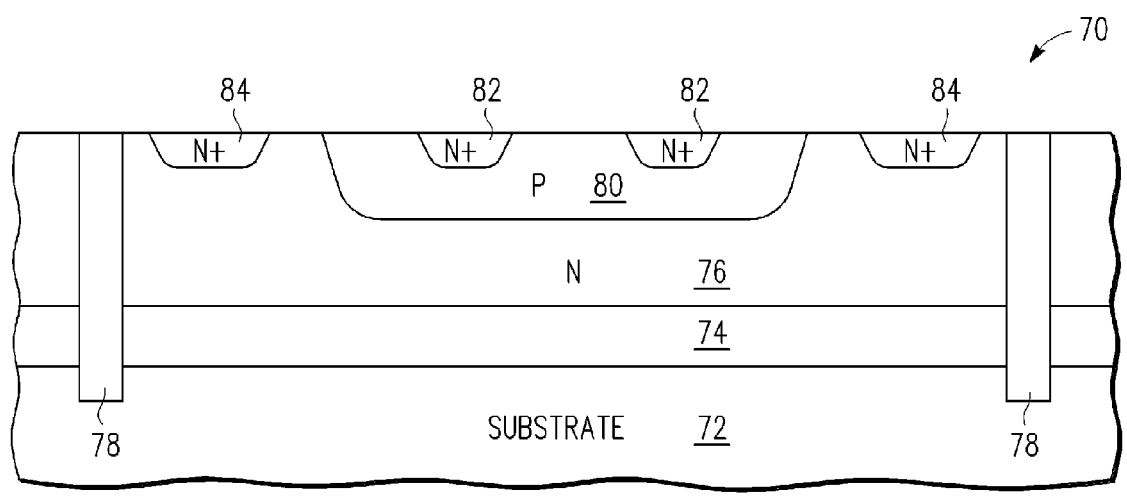
FIG. 3 is a cross-sectional view of a portion of a unit cell device of a power transistor.

FIG. 3 is a cross-sectional view of a portion of a unit cell device 70 of a power transistor. Semiconductor device manufacturing techniques and devices are known in the art and thus only those aspects relevant to the embodiments of the present disclosure are discussed herein. Furthermore, in connection with the drawings, some aspects are not shown for simplicity of illustration, for example, field oxide regions and full metallization details. The unit cell device 70 is formed beginning with a substrate 72, N+ buried layer (NBL) 74, and epitaxial layer 76, for example using a silicon wafer, or other suitable starting structure. Isolation trench 78 defines an outer boundary of the unit cell device 70. The unit cell device further includes base diffusion region 80, emitter diffusion regions 82, and collector diffusion regions 84. In one embodiment, epitaxial layer 76 comprises an N-type layer, base diffusion region 80 comprises a P-type diffusion region, emitter diffusion regions 82 comprise N+ diffusion regions, and collector diffusion regions 84 comprise N+ diffusion regions. The particular diffusion regions and their respective type and doping concentration are determined according to the particular requirements of a given unit cell device application.

Figure 4:
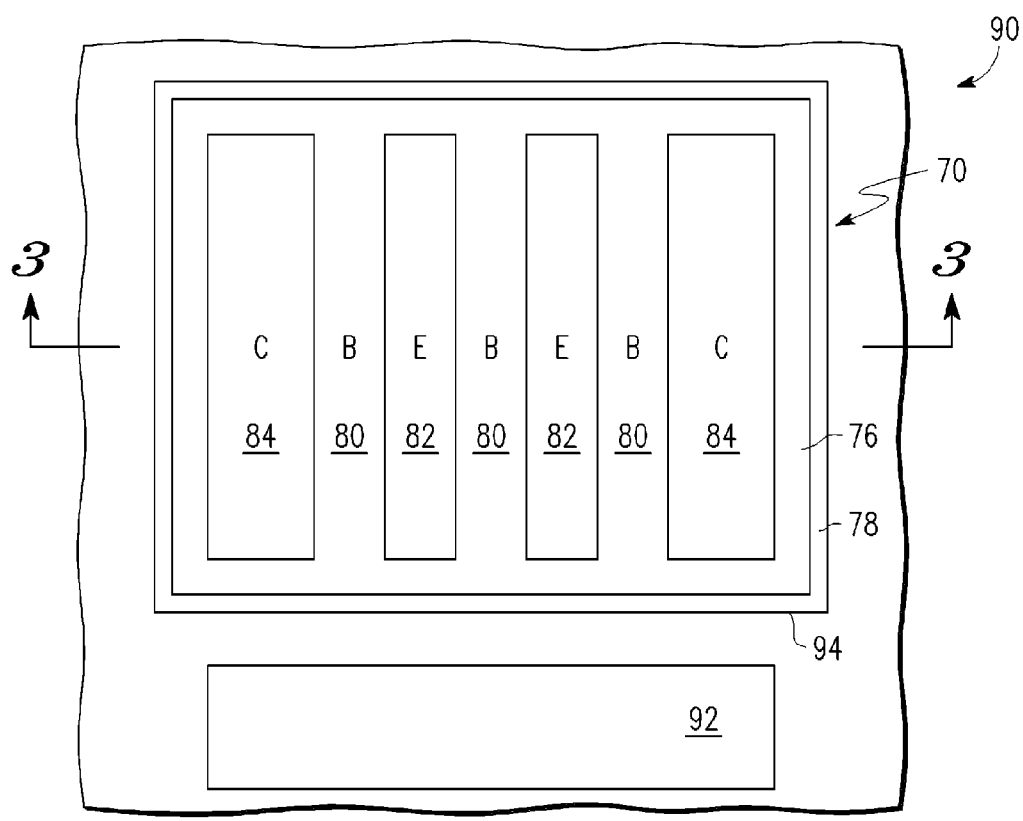
FIGS. 4-7 include illustrative views of a portion of a SSF power transistor layout configuration at various stages of fabrication thereof.

FIGS. 4-7 include illustrative views of a portion of a SSF power transistor layout configuration 90 at various stages of fabrication thereof. Referring now to FIG. 4, the SSF power transistor layout configuration 90 includes the unit cell device 70 and a ballast resistor 92. Ballast resistor 92 comprises any suitable ballast resistor formed according to the requirements of the given SSF power transistor application. In the SSF power transistor layout configuration 90, ballast resistor 92 is disposed proximate a single side edge 94 of the unit cell device 70.

Figure 5:
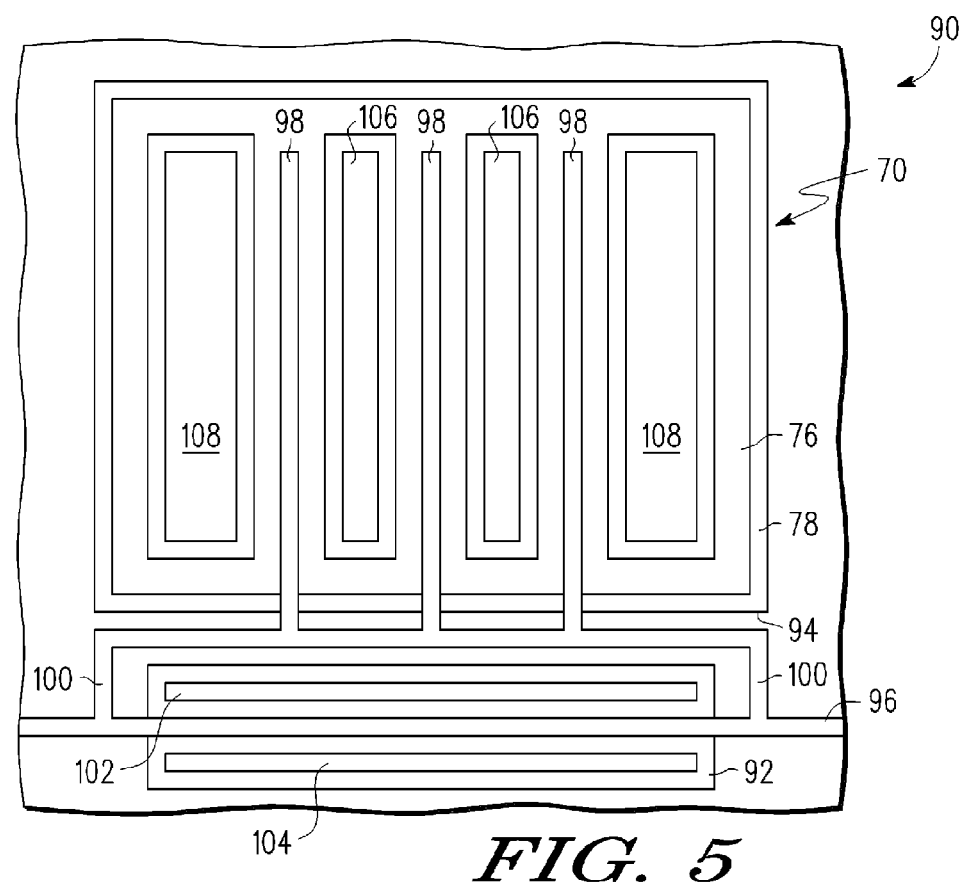

FIG. 5 illustrates the formation of a first metallization layer (e.g., M1 layer) overlying suitable isolation (not shown) on the SSF power transistor layout configuration 90. Using the first metallization layer, a base feed 96, single-sided feed base fingers 98, and single-sided feed "base finger to base feed" interconnect 100 are formed. Base feed 96 extends parallel to a single side, along a length dimension, of the bank of unit cell devices, for example, as illustrated by base metallization 52 parallel to bank 44 of FIG. 2. Single-sided feed base fingers 98 are configured to contact base regions 80 of FIG. 3, for example, using vias or other suitable metallization interconnects. In addition, during power transistor device operation, given that the base fingers 98 are fed current from one side only, they are referred to herein as single-sided feed base fingers.

In addition, the first metallization layer also forms first and second portions 102 and 104, respectively, of metallization configured to contact ballast resistor 92, as will be discussed further herein below. Furthermore, the first metallization layer also forms portions of metallization 106 configured to contact emitter regions 82 (FIG. 4) and portions of metallization 108 configured to contact collector regions 84 (FIG. 4), as will be discussed further herein below.

Figure 6:
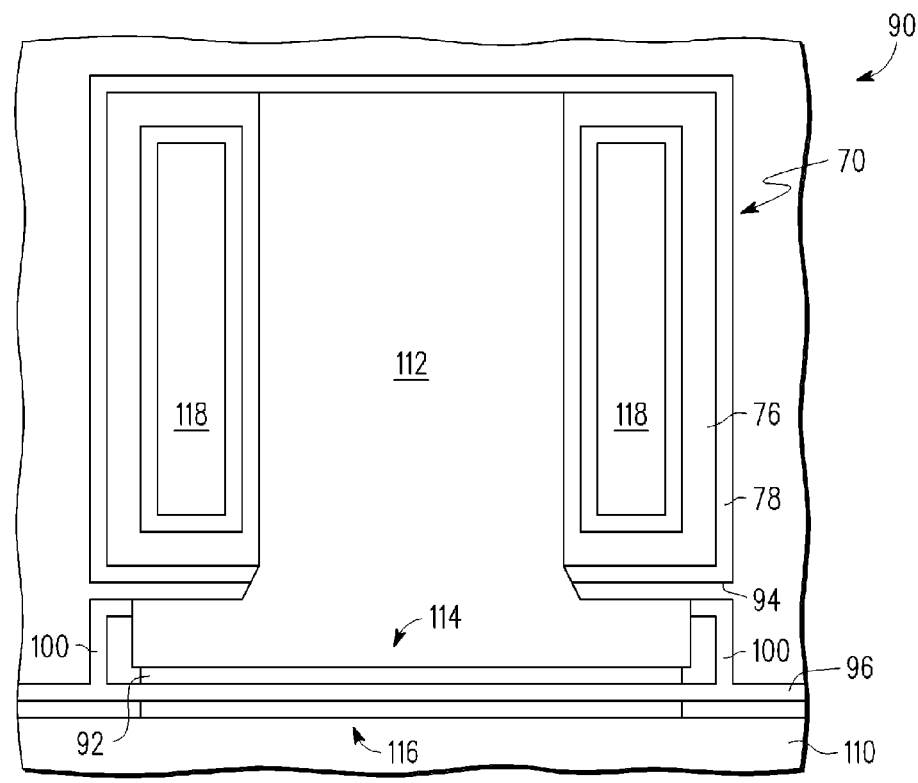

FIG. 6 illustrates the formation of a second metallization layer (e.g., M2 layer) overlying suitable isolation (not shown) on the first metallization layer. Using the second metallization layer, an emitter feed 110 and emitter metallization for single-sided feed emitter fingers 112 is formed. Emitter feed 110 extends parallel to a single side, along a length dimension, of the bank of unit cell devices, for example, as illustrated by emitter feed metallization 56 parallel to bank 44 of FIG. 2. Emitter metallization for single-sided feed emitter fingers 112 is configured to contact emitter regions 82 of FIG. 3, for example, using suitable vias and/or other metallization interconnects, such as the portions 106 of M1 metallization (FIG. 5). In addition, during power transistor device operation, given that the emitter metallization 112 carries (e.g., conducts) current from one side only, the emitter fingers are referred to herein as single-sided feed emitter fingers.

In addition, the second metallization layer is also configured to electrically couple with first and second portions 102 and 104, respectively, of metallization configured to contact ballast resistor 92. Portion 114 of the emitter metallization for single-side feed emitter fingers 112, proximate side edge 94 of unit cell device 70, is configured to electrically couple with the underlying first portion 102 of the first metallization layer (FIG. 5). Furthermore, portion 116 of the emitter feed 110 is configured to electrically couple with the underlying second portion 104 of the first metallization layer (FIG. 5). Furthermore, the second metallization layer also forms portions of metallization 118 configured to contact portions of metallization 108 of the first metallization layer (FIG. 5), as will be discussed further herein below.

Figure 7:
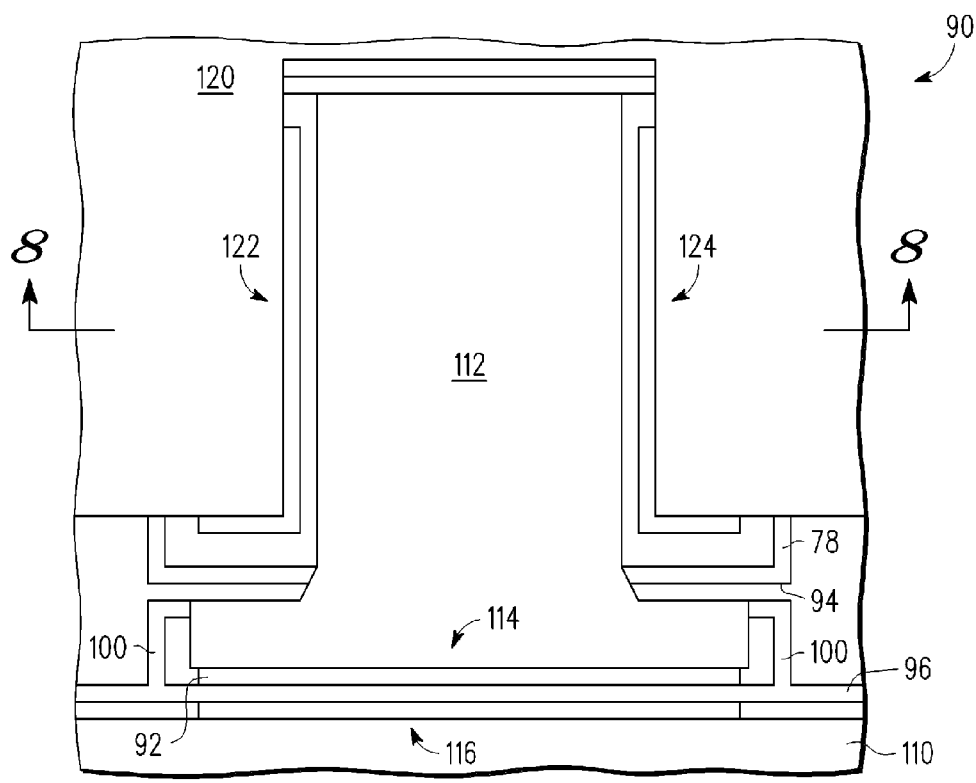

FIG. 7 illustrates the formation of a third metallization layer (e.g., top metal layer (TM layer)) overlying suitable isolation (not shown) on the second metallization layer. Using the third metallization layer, a collector metallization 120 is formed. Collector metallization 120 extends along a length dimension of the bank of unit cell devices, for example, as illustrated by collector metallization 62 parallel to bank 44 of FIG. 2. Collector metallization 120 is configured to contact collector regions 84 of FIG. 4, for example, using suitable vias and/or other metallization interconnects, such as the portions 118 of M2 metallization (FIG. 6) and 108 of M1 metallization (FIG. 5). In other words, portions 122 and 124 of the collector metallization 120 are configured to electrically couple with the underlying portions of the second and first metallization layers (118 of FIGS. 6 and 108 of FIG. 5, respectively).

Figure 8:
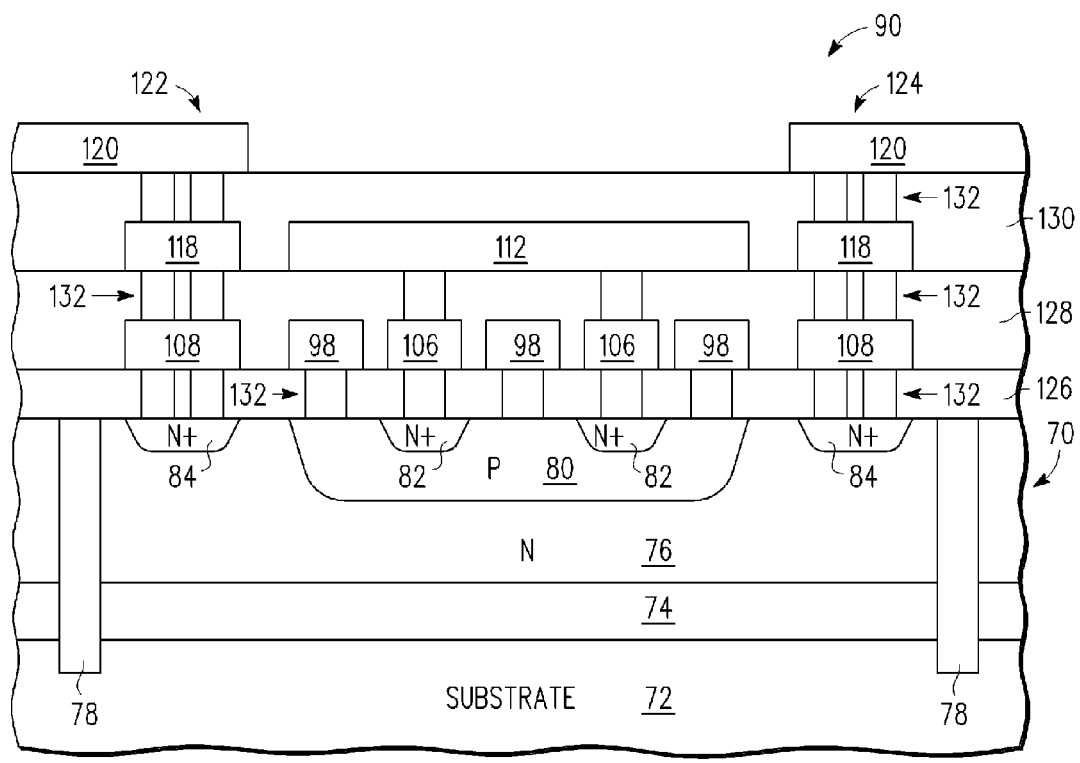
FIG. 8 is a cross-sectional view of the SSF power transistor configuration of FIG. 7, taken along line 8-8.

FIG. 8 is a cross-sectional view of the SSF power transistor configuration of FIG. 7, taken along line 8-8. In addition to elements that have been discussed up to this point, FIG. 8 illustrates the various inter-level dielectric layers 126, 128, and 130. In addition, FIG. 8 illustrates various ones of the vias and/or other metallization interconnects, generally indicated by reference numeral 132, configured to electrically couple the various portions of the metallization layers as discussed herein above.

Figure 9:
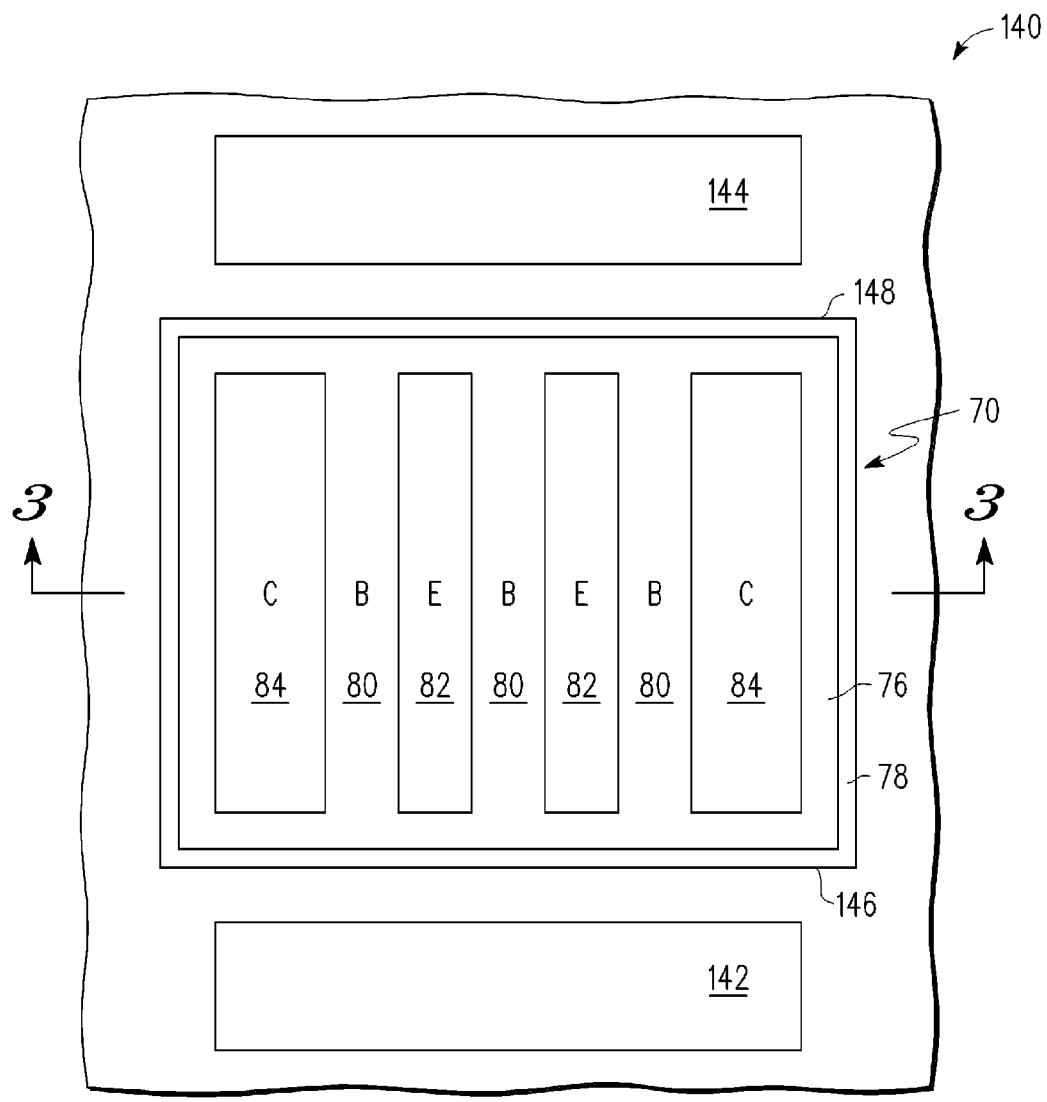
FIGS. 9-12 include illustrative views of a portion of a double-sided feed (DSF) power transistor layout configuration at various stages of fabrication thereof according to one embodiment of the present disclosure.

FIGS. 9-12 include illustrative views of a portion of a double-sided feed (DSF) power transistor layout configuration 140 at various stages of fabrication thereof according to one embodiment of the present disclosure. Note that while the embodiment of FIGS. 9-12 is illustrated by way of example using emitter ballast resistors, the embodiments of the present disclosure are not limited to an emitter ballast approach. The embodiments of the present disclosure equally apply to a base ballast approach, a combined emitter and base ballast approach, and a no ballast approach. Referring now to FIG. 9, the DSF power transistor layout configuration 140 includes the unit cell device 70 and a pair of ballast resistors 142 and 144. Ballast resistors 142 and 144 comprise any suitable ballast resistor formed according to the requirements of the given DSF power transistor application. In the DSF power transistor layout configuration 140, ballast resistor 142 is disposed proximate a first side edge 146 of the unit cell device 70 and ballast resistor 144 is disposed proximate a second side edge 148 of the unit cell device 70. In one embodiment, the first side edge 146 comprises a side edge opposite to the second side edge 148.

Figure 10:
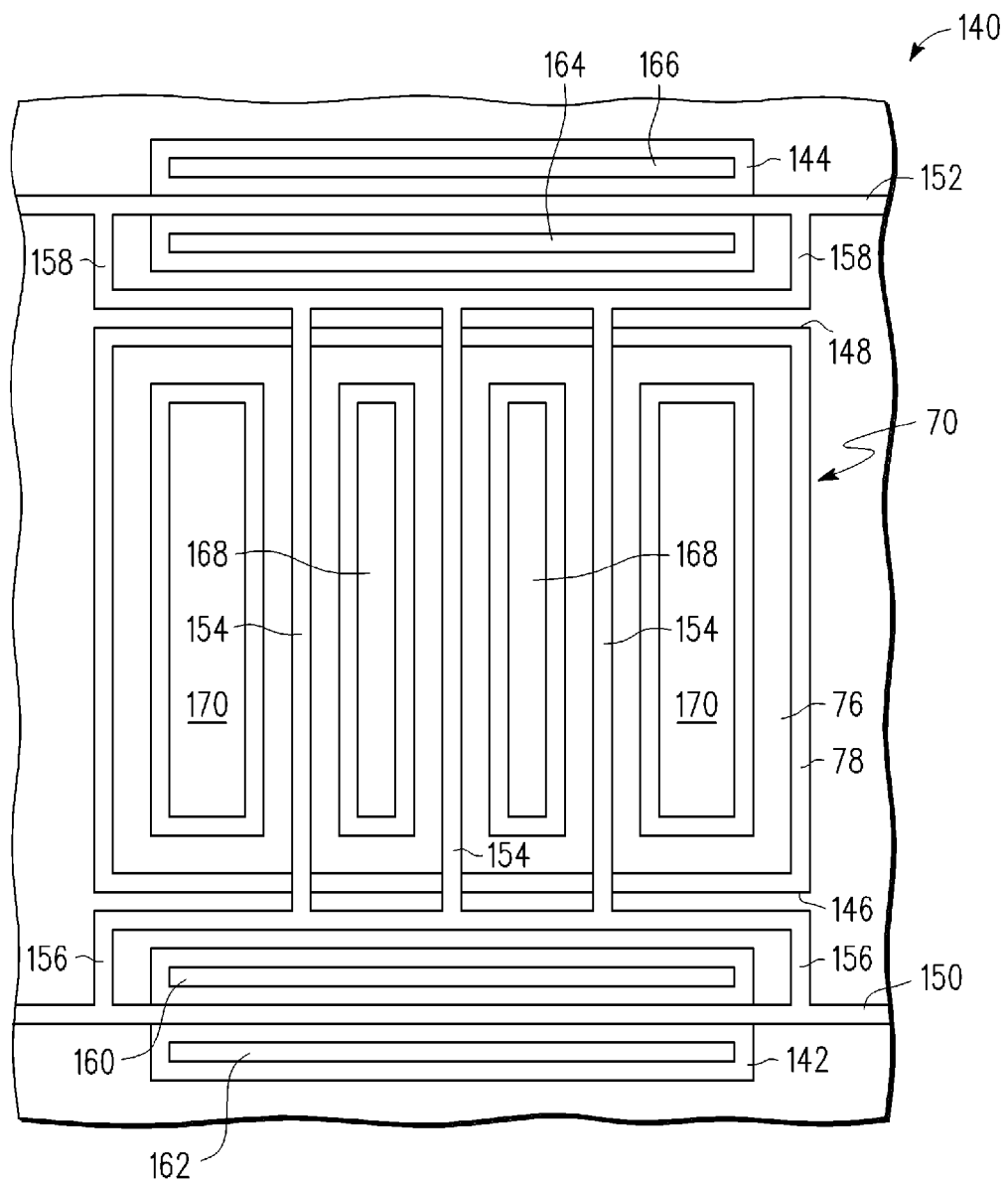

FIG. 10 illustrates the formation of a first metallization layer (e.g., M1 layer) overlying suitable isolation (not shown) on the DSF power transistor layout configuration 140. Using the first metallization layer, first and second base feeds (150, 152), double-sided feed base fingers 154, and first and second double-sided feed "base finger to base feed" interconnects (156 and 158) are formed. First base feed 150 extends parallel to a first side, along a length dimension, of the bank of unit cell devices, for example, as illustrated by base metallization 220 extending parallel to bank 212 of FIG. 16. Double-sided feed base fingers 154 are configured to contact base regions 80 of FIG. 3, for example, using vias or other suitable metallization interconnects. In addition, during power transistor device operation, given that the base fingers 154 are fed current from both ends (i.e., proximate opposite sides of unit cell 70) thereof, they are referred to herein as double-sided feed base fingers.

In addition, the first metallization layer also forms first and second portions 160 and 162, respectively, of metallization configured to contact ballast resistor 142, as will be discussed further herein below. The first metallization layer also forms first and second portions 164 and 166, respectively, of metallization configured to contact ballast resistor 144, as will be discussed further herein below. Furthermore, the first metallization layer also forms portions of metallization 168 configured to contact emitter regions 82 (FIG. 9) and portions of metallization 170 configured to contact collector regions 84 (FIG. 9), as will be discussed further herein below.

Figure 11:
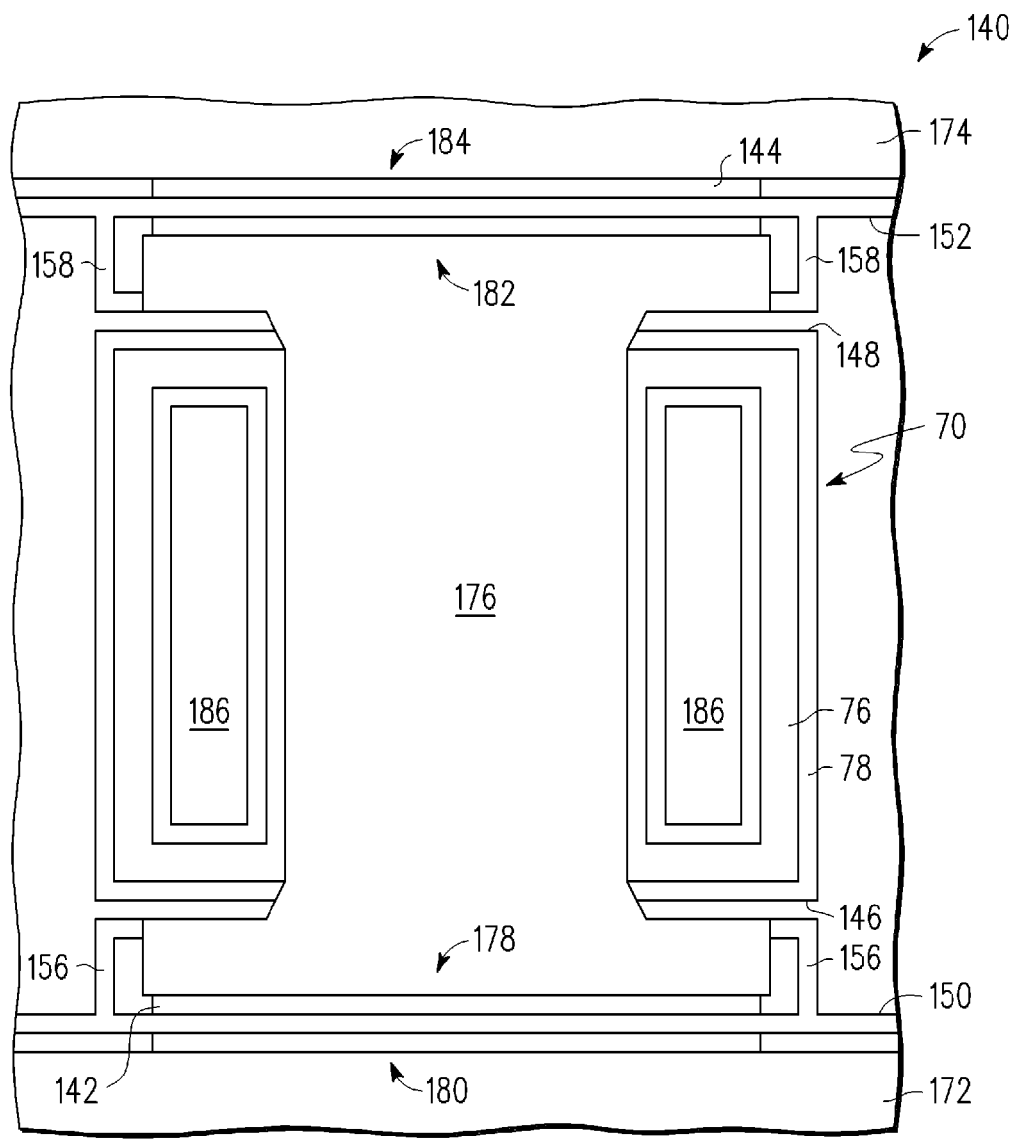

FIG. 11 illustrates the formation of a second metallization layer (e.g., M2 layer) overlying suitable isolation (not shown) on the first metallization layer. Using the second metallization layer, first and second emitter feeds (172 and 174) and emitter metallization 176 for double-sided feed emitter fingers are formed. First emitter feed 172 extends parallel to a single side, along a length dimension, of the bank of unit cell devices, for example, as illustrated by emitter metallization 222 parallel to bank 212 of FIG. 16. Emitter metallization 176 for double-sided feed emitter fingers is configured to contact emitter regions 82 of FIG. 3, for example, using suitable vias and/or other metallization interconnects, such as the portions 168 of M1 metallization (FIG. 10). In addition, during power transistor device operation, given that the emitter metallization 176 carries (i.e., conducts) current from both ends (proximate sides 146 and 148 of unit cell device 70) thereof, the emitter fingers are referred to herein as double-sided emitter fingers.

In addition, the second metallization layer is also configured to electrically couple with first and second portions 160 and 162, respectively, of metallization configured to contact ballast resistor 142. A portion 178 of the emitter metallization 176 of the double-side feed emitter fingers, proximate side edge 146 of unit cell device 70, is configured to electrically couple with the underlying first portion 160 of the first metallization layer (FIG. 10). Furthermore, portion 180 of the emitter feed 172 is configured to electrically couple with the underlying second portion 162 of the first metallization layer (FIG. 10). Another portion 182 of the emitter metallization 176 of the double-side feed emitter fingers, proximate side edge 148 of unit cell device 70, is configured to electrically couple with the underlying first portion 164 of the first metallization layer (FIG. 10). Furthermore, a portion 184 of the emitter feed 174 is configured to electrically couple with the underlying second portion 166 of the first metallization layer (FIG. 10). Furthermore, the second metallization layer also forms portions of metallization 186 configured to contact portions of metallization 170 of the first metallization layer (FIG. 10), as will be discussed further herein below.

Figure 12:
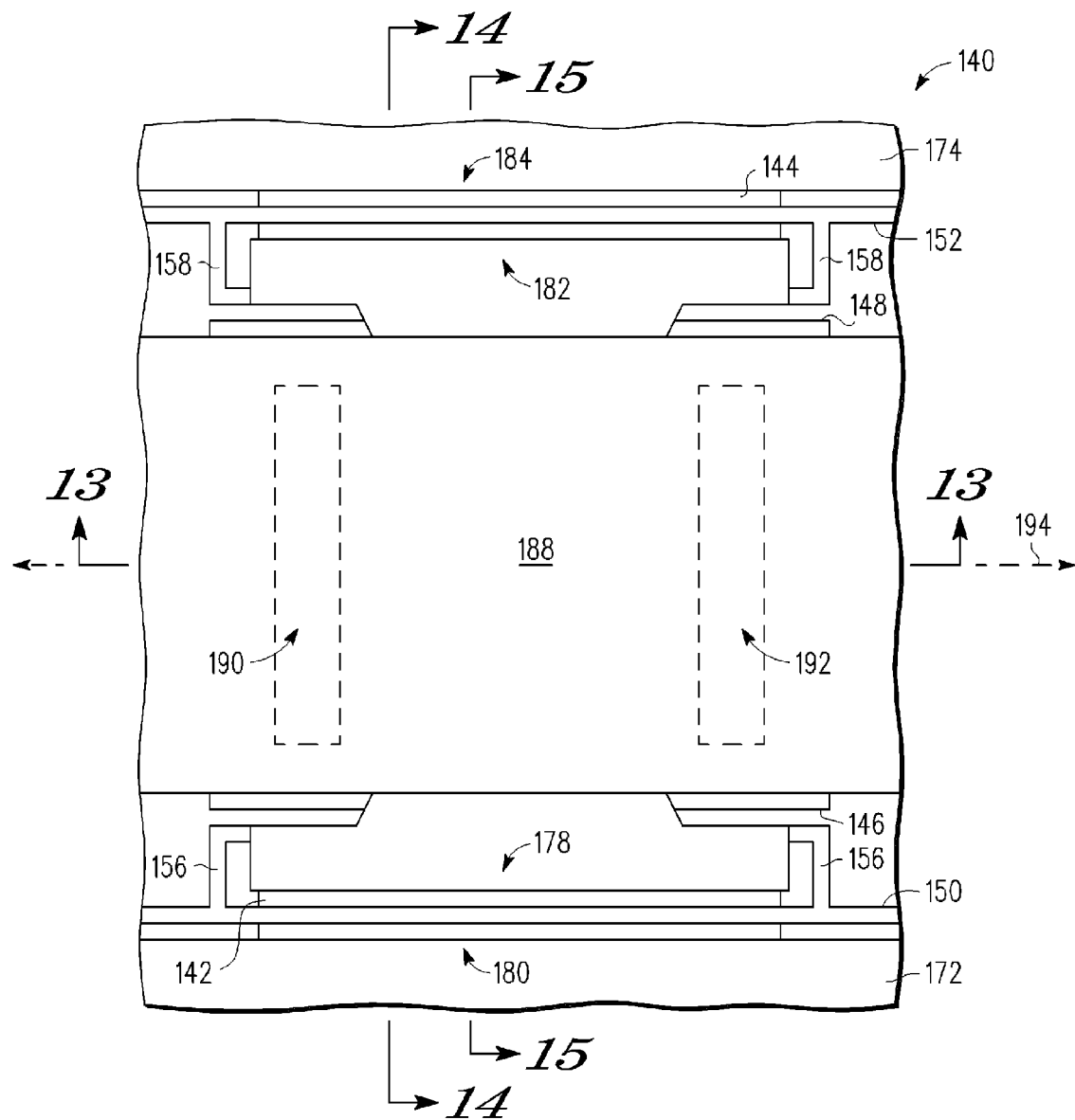

FIG. 12 illustrates the formation of a third metallization layer (e.g., top metal layer (TM layer)) overlying suitable isolation (not shown) on the second metallization layer. Using the third metallization layer, a collector metallization 188 is formed. Collector metallization 188 extends along a length dimension of the bank of unit cell devices, for example, as illustrated by the portion of collector metallization 226 extending parallel to bank 212 of FIG. 16. Collector metallization 188 is configured to contact collector regions 84 of FIG. 9, for example, using suitable vias and/or other metallization interconnects, such as the portions 186 of M2 metallization (FIG. 11) and 170 of M1 metallization (FIG. 10). In other words, portions 190 and 192 of the collector metallization 188 are configured to electrically couple with the underlying portions of the second and first metallization layers (186 of FIGS. 11 and 170 of FIG. 10, respectively). Furthermore, in one embodiment, the DSF power transistor layout configuration 140 is substantially symmetrical about an axis 194 disposed along the length dimension of the bank of unit cell devices.

Figure 13:
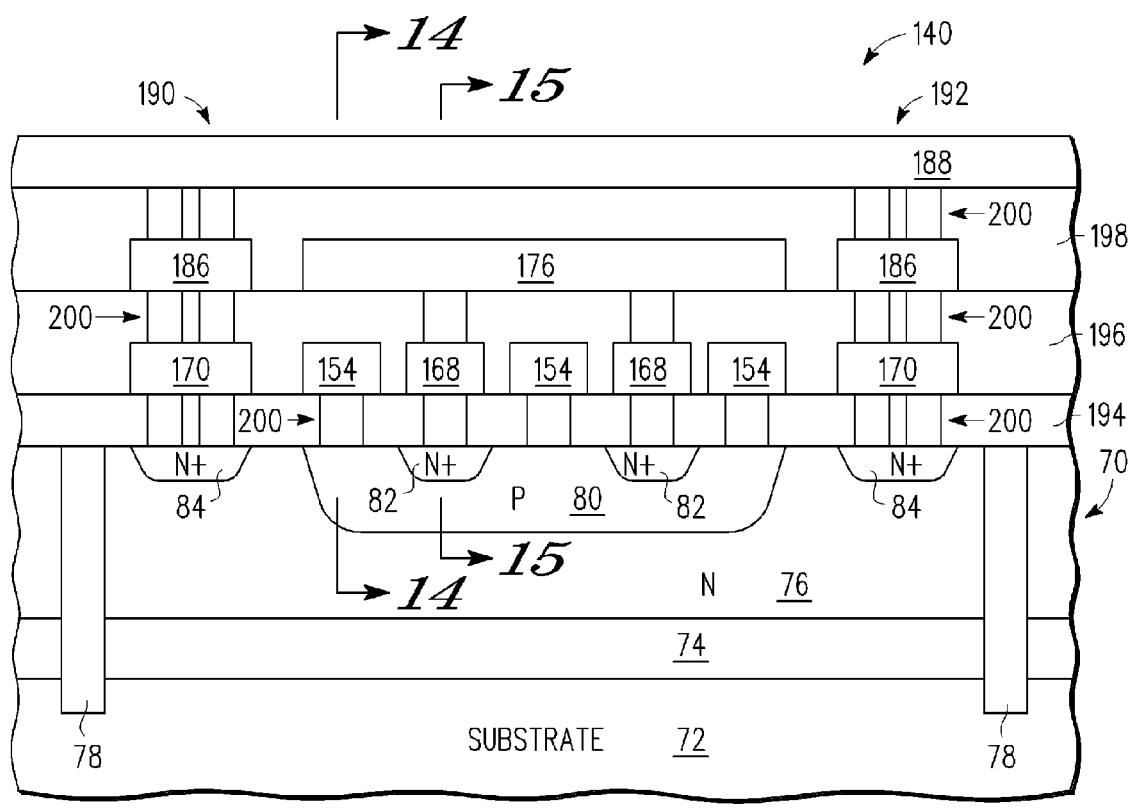
FIG. 13 is a cross-sectional view of the DSF power transistor configuration of FIG. 12, taken along line 13-13.

FIG. 13 is a cross-sectional view of the DSF power transistor configuration of FIG. 12, taken along line 13-13. In addition to elements that have been discussed herein above, FIG. 13 illustrates the various inter-level dielectric layers 194, 196, and 198. In addition, FIG. 13 illustrates various ones of the vias and/or other metallization interconnects, generally indicated by reference numeral 200, configured to electrically couple the various portions of the metallization layers as discussed herein above.

Figure 14:
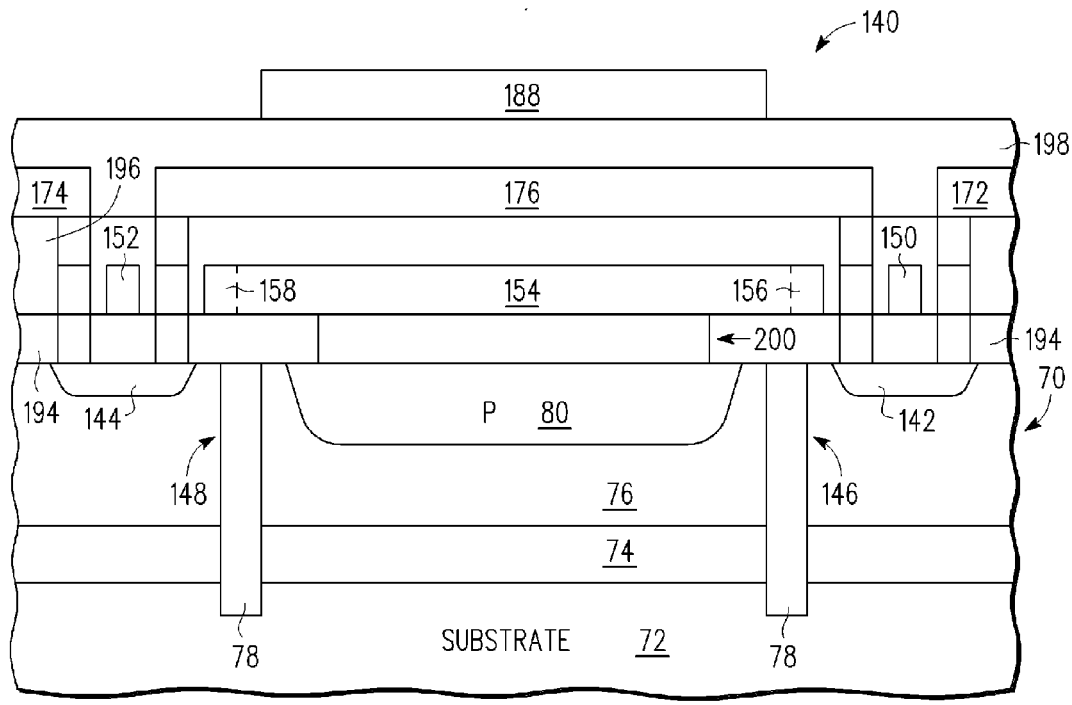
FIG. 14 is a cross-sectional view of the DSF power transistor configuration of FIG. 12, taken along line 14-14 of FIGS. 12 and 13.
Figure 15:
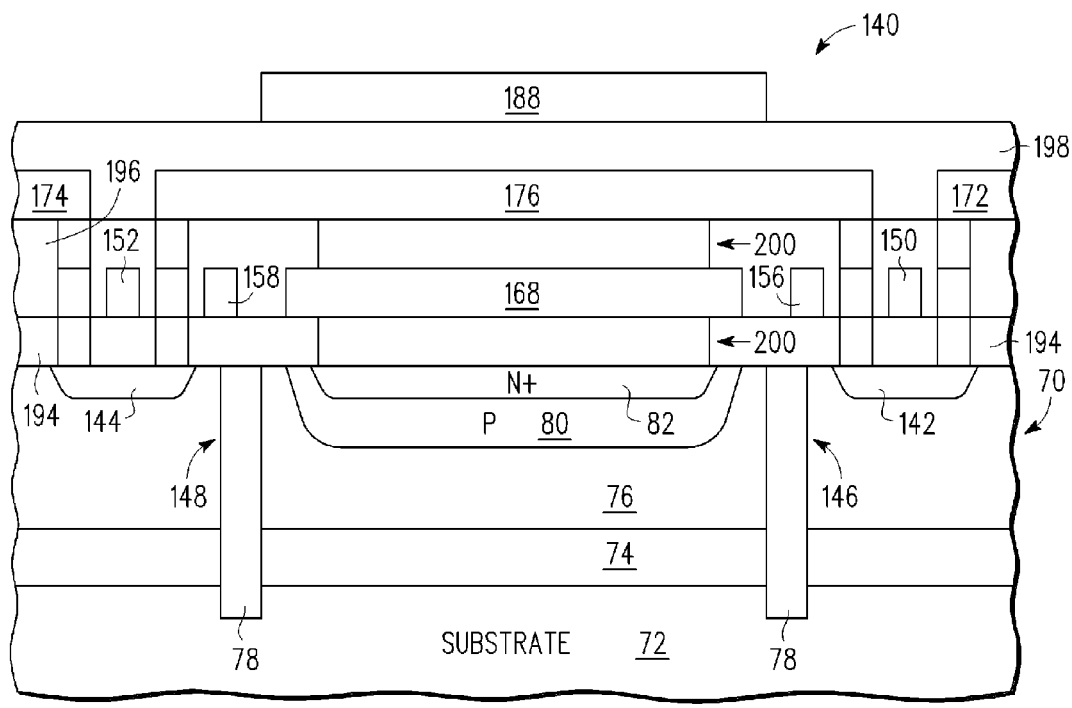
FIG. 15 is a cross-sectional view of the DSF power transistor configuration of FIG. 12, taken along line 15-15 of FIGS. 12 and 13.

FIG. 14 is a cross-sectional view of the DSF power transistor configuration 140 of FIG. 12, taken along line 14-14 of FIGS. 12 and 13. FIG. 15 is a cross-sectional view of the DSF power transistor configuration 140 of FIG. 12, taken along line 15-15 of FIGS. 12 and 13.

Figure 16:
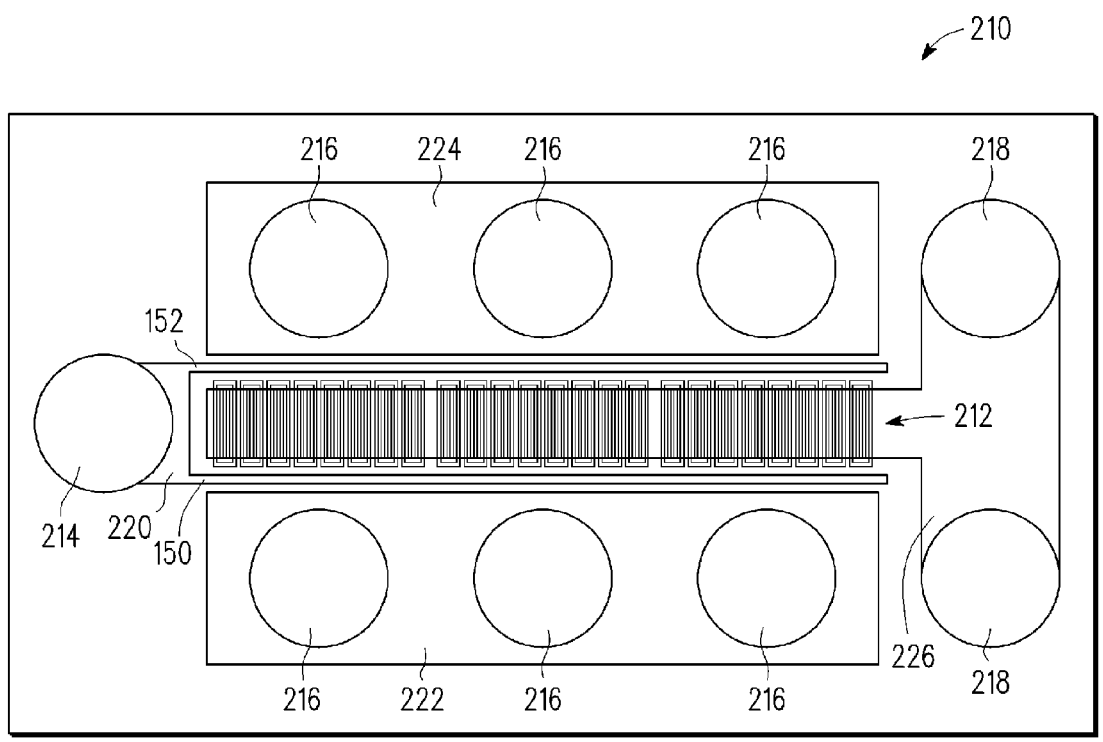
FIG. 16 is an illustrative view of a double-sided feed (DSF) power transistor flip-chip layout configuration according to one embodiment of the present disclosure.

FIG. 16 is an illustrative view of a double-sided feed (DSF) power transistor flip-chip layout configuration 210 according to one embodiment of the present disclosure. The power transistor layout 210 includes a single bank 212 of double-sided feed (DSF) power transistor unit cell devices 140. The bank 212 of DSF power transistor devices can include any number of groups of individual DSF transistor devices, wherein the number of devices per group and the number of groups in the bank of devices is determined according to the requirements of a particular power transistor application. The power transistor layout 210 further includes a base flip-chip bump site or pad 214, emitter flip-chip bump sites or pads 216, and collector flip-chip bump sites or pads 218. The base flip-chip bump site 214 couples to the bases of the DSF power transistor unit cell devices 140 of the bank of DSF power transistor devices (212) via base feed metallization 220.

The emitter flip-chip bump sites 216 couple to the emitters of the DSF power transistor unit cell devices 140 of the bank of DSF power transistor devices (212) via emitter feed metallizations 222 and 224, respectively. More particularly, the emitter feed metallizations (222 and 224) couple to the emitters of the bank (212) via respective emitter ballast resistors, formed within the substrate of the power transistor device. In addition, the collector flip-chip bump sites 218 couple to the collectors of the DSF power transistor unit cell devices of the bank of DSF power transistor devices (212) via collector metallization 226. The flip-chip bump sites 214, 216 and 218 are located proximate an outer periphery of the power transistor layout. A portion of the bank of DSF unit cell devices has been discussed herein with respect to FIGS. 9-15.

The power transistor featuring symmetrical flip-chip designs with double-sided feed of the emitter and base fingers according to the embodiments of the present disclosure advantageously provide for a power transistor featuring improved RF performance, enhanced ruggedness, and reduced die size. Such a power transistor device is suitable for wireless power amplifier applications. For example, the symmetrical flip-chip designs with double-sided feed of the emitter and base fingers advantageously provides for improved heat dissipation (for maintaining a given thermal stability), a given die size reduction over single-side feed devices, improved electrical grounding, and reduced presence of undesirable interconnect inductance.

Improved heat dissipation is achieved with the devices according to the embodiments of the present disclosure by the presence of conductive bumps located on both sides of the device, e.g., proximate both ends of the base and emitter fingers of the bank of unit cell devices and thus doubling the number of thermal conductors to the substrate. As a result, improved thermal stability allows for a reduction in die area, and/or a reduction in emitter ballast resistance required to avoid thermal runaway, and maintain ruggedness, corresponding to an ability to withstand mismatch at the device output. In addition, the double-sided base and emitter feed reduces base and emitter routing resistance and inductance. Furthermore, with the embodiments of the present disclosure, improved RF performance is also achieved due to an effectively shorter finger length, wherein current for the emitter and base fingers is routed from both ends of the respective fingers. Moreover, RF performance is improved both by the reduction in routing resistance and inductance, and by the reduced value of the emitter ballast resistance.

By now it should be appreciated that there has been provided a power transistor which includes a plurality of unit cell devices (i.e., a bank of devices) arranged along an axis. Each unit cell device includes a base portion, an emitter portion, and a collector portion. The base contact configuration includes a first base feed and a second base feed, the first base feed being coupled to the base portion of each unit cell device via a first end of at least one base finger associated with a corresponding unit cell device and the second base feed being coupled to the base portion of each unit cell device via an opposite end of the at least one base finger associated with the corresponding unit cell device. The unit cell device further includes an emitter contact configuration including a first emitter feed and a second emitter feed. The first emitter feed is coupled to the emitter portion of each unit cell device via a first end of an emitter finger associated with a corresponding unit cell device and the second emitter feed is coupled to the emitter portion of each unit cell device via an opposite end of the emitter finger associated with the corresponding unit cell device. The unit cell device further includes a collector contact configuration having a collector feed, the collector feed being electrically coupled to the collector portion of each unit cell device.

In one embodiment, the base portion, the emitter portion, and the collector portion of each unit cell are oriented substantially perpendicular and symmetrical to the axis. In another embodiment, the first base feed is positioned on a first side of the axis and the second base feed is substantially symmetrically positioned on a second side of the axis, opposite the first side. In yet another embodiment, the at least one base finger is substantially perpendicular to the axis. In a further embodiment, the at least one base finger comprises three base fingers.

In another embodiment of the power transistor, the first base feed couples to the base portion of each unit cell device via a first interconnect at the first end of the at least one base finger associated with the corresponding unit cell device and wherein the second base feed couples to the base portion of each unit cell device via a second interconnect at the second end, opposite the first end, of the at least one base finger associated with the corresponding unit cell device. The first and second interconnects each include a conductive path having a first end and a second end, further wherein both of the first and second ends of the conductive path are coupled to respective ones of the first and second base feeds, further wherein the at least one base finger couples to respective ones of the first and second interconnects in a region that is proximate a region in-between the first and second ends of a corresponding conductive path of the respective interconnect.

In a still further embodiment, the base contact configuration further comprises a flip-chip base contact configuration. The flip-chip base contact configuration includes a base flip-chip bump site configured to receive a conductive flip-chip bump. The flip-chip bump site is located substantially symmetrical about the axis proximate an end of the plurality of unit cell devices.

In another embodiment, the first emitter feed is positioned on a first side of the axis and the second emitter feed is substantially symmetrically positioned on a second side of the axis, opposite the first side. The first emitter feed electrically couples to the emitter portion of each unit cell device via a ballast resistor coupled to the first end of the emitter finger associated with the corresponding unit cell device. In addition, the second emitter feed electrically couples to the emitter portion of each unit cell device via another ballast resistor coupled to the second end, opposite the first end, of the emitter finger associated with the corresponding unit cell device.

In a further embodiment, the emitter contact configuration comprises a flip-chip emitter contact configuration having emitter flip-chip bump sites configured to receive conductive flip-chip bumps. The flip-chip bump sites are located in a substantially symmetrical layout about the axis, proximate to and along a length dimension of the plurality of unit cell devices. The collector contact configuration further comprises a flip-chip collector contact configuration having collector flip-chip bump sites configured to receive conductive flip-chip bumps. The collector flip-chip bump sites are located in a substantially symmetrical layout about the axis, proximate an end of the plurality of unit cell devices.

As discussed herein, a power transistor includes a plurality of unit cell devices arranged along an axis, each unit cell device including a base portion, an emitter portion, and a collector portion, wherein the base portion, the emitter portion, and the collector portion of each unit cell are oriented substantially perpendicular and symmetrical to the axis. The transistor further includes a base contact configuration including a first base feed and a second base feed. The first base feed is electrically coupled to the base portion of each unit cell device via a first end of at least one base finger associated with a corresponding unit cell device and the second base feed is electrically coupled to the base portion of each unit cell device via an opposite end of the at least one base finger associated with the corresponding unit cell device. The first base feed is positioned on a first side of the axis and the second base feed is substantially symmetrically positioned on a second side of the axis, opposite the first side.

The power transistor further includes an emitter contact configuration including a first emitter feed and a second emitter feed, the first emitter feed being electrically coupled to the emitter portion of each unit cell device via a first end of an emitter finger associated with a corresponding unit cell device and the second emitter feed being coupled to the emitter portion of each unit cell device via an opposite end of the emitter finger associated with the corresponding unit cell device. The first emitter feed is positioned on a first side of the axis and the second emitter feed is substantially symmetrically positioned on a second side of the axis, opposite the first side. The power transistor still further includes a collector contact configuration including a collector feed, the collector feed being electrically coupled to the collector portion of each unit cell device.

In a further embodiment, the at least one base finger is substantially perpendicular to the axis, and wherein the first emitter feed couples to the emitter portion of each unit cell device via a ballast resistor coupled to the first end of the emitter finger associated with the corresponding unit cell device and wherein the second emitter feed couples to the emitter portion of each unit cell device via another ballast resistor coupled to the second end, opposite the first end, of the emitter finger associated with the corresponding unit cell device.

In a still further embodiment, the base contact configuration further comprises a flip-chip base contact configuration having a base flip-chip bump site configured to receive a conductive flip-chip bump, wherein the emitter contact configuration further comprises a flip-chip emitter contact configuration having emitter flip-chip bump sites configured to receive conductive flip-chip bumps, and wherein the collector contact configuration further comprises a flip-chip collector contact configuration having collector flip-chip bump sites configured to receive conductive flip-chip bumps. Furthermore, the base flip-chip bump site is located substantially symmetrical about the axis proximate an end of the plurality of unit cell devices, further wherein the emitter flip-chip bump sites are located in a substantially symmetrical layout about the axis, proximate to and along a length dimension of the plurality of unit cell devices, and further wherein the collector flip-chip bump sites are located in a substantially symmetrical layout about the axis, proximate another end of the plurality of unit cell devices, opposite to the end proximate the base flip-chip bump site.

The embodiments of the present disclosure also include a method of making a power transistor comprising: forming a plurality of unit cell devices arranged along an axis, each unit cell device including a base portion, an emitter portion, and a collector portion; forming a base contact configuration that includes a first base feed and a second base feed, wherein forming includes (i) coupling the first base feed to the base portion of each unit cell device via a first end of at least one base finger associated with a corresponding unit cell device and (ii) coupling the second base feed to the base portion of each unit cell device via an opposite end of the at least one base finger associated with the corresponding unit cell device; forming an emitter contact configuration that includes a first emitter feed and a second emitter feed, wherein forming includes (i) coupling the first emitter feed to the emitter portion of each unit cell device via a first end of an emitter finger associated with a corresponding unit cell device and (ii) coupling the second emitter feed to the emitter portion of each unit cell device via an opposite end of the emitter finger associated with the corresponding unit cell device; and forming a collector contact configuration including a collector feed, wherein forming includes coupling the collector feed to the collector portion of each unit cell device.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the foregoing specification, the invention has been described with reference to specific embodiments. However, one of ordinary skill in the art appreciates that various modifications and changes can be made without departing from the scope of the present invention as set forth in the claims below. For example, the embodiments of the present disclosure can be used in wireless subscriber power amplifier applications, such as, WCDMA, WLAN, GSM, WiMax, etc. In addition, the embodiments of the present disclosure can be applied to a number of different power amplifier devices, including Si-based, SiGe-based, or other technologies used to produce power amplifier devices. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The term "plurality", as used herein, is defined as two or more than two. The term another, as used herein, is defined as at least a second or more.

The term "coupled", as used herein, is defined as connected, although not necessarily directly, and not necessarily mechanically.

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." Thus, as used above, when the invention is described in the context of one embodiment, that one embodiment is one of many possible embodiments of the invention.

Notwithstanding the above caveat regarding the use of the words "one embodiment" in the detailed description, it will be understood by those within the art that if a specific number of an introduced claim element is intended in the below claims, such an intent will be explicitly recited in the claim, and in the absence of such recitation no such limitation is present or intended. For example, in the claims below, when a claim element is described as having "one" feature, it is intended that the element be limited to one and only one of the feature described.

Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless expressly indicated otherwise, terms such as "first" and "second" are used to arbitrarily distinguish between the elements such terms describe. Thus, these terms are not necessarily intended to indicate temporal or other prioritization of such elements.

What is claimed is:

1. A power transistor comprising:
   a plurality of unit cell devices arranged along an axis, each unit cell device including a base portion, an emitter portion, and a collector portion;
   a base contact configuration including a first base feed and a second base feed, the first base feed being coupled to the base portion of each unit cell device via a first end of at least one base finger associated with a corresponding unit cell device and the second base feed being coupled to the base portion of each unit cell device via an opposite end of the at least one base finger associated with the corresponding unit cell device;
   an emitter contact configuration including a first emitter feed and a second emitter feed, the first emitter feed being coupled to the emitter portion of each unit cell device via a first end of an emitter finger associated with a corresponding unit cell device and the second emitter feed being coupled to the emitter portion of each unit cell device via an opposite end of the emitter finger associated with the corresponding unit cell device; and
   a collector contact configuration including a collector feed, the collector feed being coupled to the collector portion of each unit cell device.

2. The transistor of claim 1, wherein the base portion, the emitter portion, and the collector portion of each unit cell are oriented substantially perpendicular and symmetrical to the axis.

3. The transistor of claim 1, wherein the first base feed is positioned on a first side of the axis and the second base feed is substantially symmetrically positioned on a second side of the axis, opposite the first side.

4. The transistor of claim 1, wherein the at least one base finger is substantially perpendicular to the axis.

5. The transistor of claim 1, wherein the at least one base finger comprises three base fingers.

6. The transistor of claim 1, further wherein the first base feed couples to the base portion of each unit cell device via a first interconnect at the first end of the at least one base finger associated with the corresponding unit cell device and wherein the second base feed couples to the base portion of each unit cell device via a second interconnect at the second end, opposite the first end, of the at least one base finger associated with the corresponding unit cell device.

7. The transistor of claim 6, wherein the first and second interconnects each include a conductive path having a first end and a second end, further wherein both of the first and second ends of the conductive path are coupled to respective ones of the first and second base feeds, further wherein the at least one base finger couples to respective ones of the first and second interconnects in a region that is proximate a region in-between the first and second ends of a corresponding conductive path of the respective interconnect.

8. The transistor of claim 1, wherein the base contact configuration further comprises a flip-chip base contact configuration having a base flip-chip bump site configured to receive a conductive flip-chip bump.

9. The transistor of claim 8, further wherein the flip-chip bump site is located substantially symmetrical about the axis proximate an end of the plurality of unit cell devices.

10. The transistor of claim 1, wherein the first emitter feed is positioned on a first side of the axis and the second emitter feed is substantially symmetrically positioned on a second side of the axis, opposite the first side.

11. The transistor of claim 1, further wherein the first emitter feed couples to the emitter portion of each unit cell device via a ballast resistor coupled to the first end of the emitter finger associated with the corresponding unit cell device and wherein the second emitter feed couples to the emitter portion of each unit cell device via another ballast resistor coupled to the second end, opposite the first end, of the emitter finger associated with the corresponding unit cell device.

12. The transistor of claim 11, wherein the emitter contact configuration further comprises a flip-chip emitter contact configuration having emitter flip-chip bump sites configured to receive conductive flip-chip bumps.

13. The transistor of claim 12, further wherein the flip-chip bump sites are located in a substantially symmetrical layout about the axis, proximate to and along a length dimension of the plurality of unit cell devices.

14. The transistor of claim 1, wherein the collector contact configuration further comprises a flip-chip collector contact configuration having collector flip-chip bump sites configured to receive conductive flip-chip bumps.

15. The transistor of claim 14, further wherein the flip-chip bump sites are located in a substantially symmetrical layout about the axis, proximate an end of the plurality of unit cell devices.

16. A power transistor comprising:
   a plurality of unit cell devices arranged along an axis, each unit cell device including a base portion, an emitter portion, and a collector portion, wherein the base portion, the emitter portion, and the collector portion of each unit cell are oriented substantially perpendicular and symmetrical to the axis;

a base contact configuration including a first base feed and a second base feed, the first base feed being coupled to the base portion of each unit cell device via a first end of at least one base finger associated with a corresponding unit cell device and the second base feed being coupled to the base portion of each unit cell device via an opposite end of the at least one base finger associated with the corresponding unit cell device, wherein the first base feed is positioned on a first side of the axis and the second base feed is substantially symmetrically positioned on a second side of the axis, opposite the first side;

an emitter contact configuration including a first emitter feed and a second emitter feed, the first emitter feed being coupled to the emitter portion of each unit cell device via a first end of an emitter finger associated with a corresponding unit cell device and the second emitter feed being coupled to the emitter portion of each unit cell device via an opposite end of the emitter finger associated with the corresponding unit cell device, wherein the first emitter feed is positioned on a first side of the axis and the second emitter feed is substantially symmetrically positioned on a second side of the axis, opposite the first side; and a collector contact configuration including a collector feed, the collector feed being coupled to the collector portion of each unit cell device.

17. The transistor of claim 16, wherein the at least one base finger is substantially perpendicular to the axis, and wherein the first emitter feed couples to the emitter portion of each unit cell device via a ballast resistor coupled to the first end of the emitter finger associated with the corresponding unit cell device and wherein the second emitter feed couples to the emitter portion of each unit cell device via another ballast resistor coupled to the second end, opposite the first end, of the emitter finger associated with the corresponding unit cell device.

18. The transistor of claim 16, wherein the base contact configuration further comprises a flip-chip base contact configuration having a base flip-chip bump site configured to receive a conductive flip-chip bump, wherein the emitter contact configuration further comprises a flip-chip emitter contact configuration having emitter flip-chip bump sites configured to receive conductive flip-chip bumps, and wherein the collector contact configuration further comprises a flip-chip collector contact configuration having collector flip-chip bump sites configured to receive conductive flip-chip bumps.

19. The transistor of claim 18, further wherein the base flip-chip bump site is located substantially symmetrical about the axis proximate an end of the plurality of unit cell devices, further wherein the emitter flip-chip bump sites are located in a substantially symmetrical layout about the axis, proximate to and along a length dimension of the plurality of unit cell devices, and further wherein the collector flip-chip bump sites are located in a substantially symmetrical layout about the axis, proximate another end of the plurality of unit cell devices, opposite to the end proximate the base flip-chip bump site.

* * * * *